(12) United States Patent
Harada et al.

(10) Patent No.: US 12,087,849 B2
(45) Date of Patent: Sep. 10, 2024

(54) SEMICONDUCTOR DEVICE

(71) Applicant: FUJI ELECTRIC CO., LTD., Kanagawa (JP)

(72) Inventors: Yuichi Harada, Matsumoto (JP); Seiji Noguchi, Matsumoto (JP); Norihiro Komiyama, Matsumoto (JP); Yoshihiro Ikura, Matsumoto (JP); Yosuke Sakurai, Azumino (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 538 days.

(21) Appl. No.: 17/356,585

(22) Filed: Jun. 24, 2021

(65) Prior Publication Data
US 2021/0320195 A1    Oct. 14, 2021

Related U.S. Application Data

(63) Continuation of application No. PCT/JP2020/020523, filed on May 25, 2020.

(30) Foreign Application Priority Data

Jul. 31, 2019    (JP) .................................. 2019-141434

(51) Int. Cl.
*H01L 29/739*    (2006.01)
*H01L 29/10*    (2006.01)
*H01L 29/40*    (2006.01)

(52) U.S. Cl.
CPC ...... *H01L 29/7397* (2013.01); *H01L 29/1095* (2013.01); *H01L 29/407* (2013.01)

(58) Field of Classification Search
CPC ........................ H01L 29/7397; H01L 29/1095; H01L 29/407
See application file for complete search history.

(56) References Cited

U.S. PATENT DOCUMENTS

| | | | |
|---|---|---|---|
| 2009/0189181 A1 | 7/2009 | Koyama | |
| 2016/0372585 A1 | 12/2016 | Furukawa | |
| 2017/0236926 A1* | 8/2017 | Imagawa | ............ H01L 29/7397 257/144 |
| 2018/0204909 A1* | 7/2018 | Konishi | .............. H01L 29/1095 |

FOREIGN PATENT DOCUMENTS

| | | |
|---|---|---|
| JP | 2002016252 A | 1/2002 |
| JP | 2009206478 A | 9/2009 |
| JP | 2017147300 A | 8/2017 |
| WO | 2015162811 A1 | 10/2015 |
| WO | 2017033315 A | 3/2017 |

OTHER PUBLICATIONS

International Search Report and (ISA/237) Written Opinion of the International Search Authority for International Patent Application No. PCT/JP2020/020523, mailed by the Japan Patent Office on Aug. 18, 2020.

\* cited by examiner

*Primary Examiner* — Christine A Enad

(57) ABSTRACT

Provided is a semiconductor device that has a plurality of gate trench portions electrically connected to a gate electrode, and a plurality of dummy trench portions electrically connected to an emitter electrode, and includes a first trench group that includes one gate trench portion and two dummy trench portions adjacent to the gate trench portion and adjacent to each other, and a second trench group that includes two gate trench portions adjacent to each other.

20 Claims, 11 Drawing Sheets

SEMICONDUCTOR DEVICE

The contents of the following Japanese patent applications are incorporated herein by reference:
NO. 2019-141434 filed in JP on Jul. 31, 2019; and
NO. PCT/JP2020/020523 filed in WO on May 25, 2020

BACKGROUND

1. Technical Field

The present invention relates to a semiconductor device.

2. Related Art

Conventionally, IGBTs (Insulated Gate Bipolar Transistor) of a trench gate type or MOSFETs (metal-oxide-semiconductor field effect transistor) of a vertical type have a repeated structure in which a dummy trench portion is provided at a certain ratio with respect to a gate trench portion (for example, see Patent Literature 1 and Patent Literature 2).

CITATION LIST

Patent Literature

Patent Literature 1: WO2015/162811
Patent Literature 2: WO2017/033315

DESCRIPTION OF EXEMPLARY EMBODIMENTS

Hereinafter, the invention will be described through embodiments of the invention, but the following embodiments do not limit the invention according to claims. In addition, not all of the combinations of features described in the embodiments are essential to the solving means of the invention.

In the present specification, one side in a direction parallel to the depth direction of a semiconductor substrate is referred to as "upper" or "front", and the other side is referred to as "lower" or "rear". One of the two main surfaces of the substrate, layer, or other members is called an upper surface, and the other surface is referred to as a lower surface. The directions of "up", "down", "front", and "rear" are not limited to the direction of gravity or the direction of attachment to the substrate or the like when a semiconductor device is mounted.

In this specification, technical matters may be described using orthogonal coordinate axes of an X axis, a Y axis, and a Z axis. In this specification, a plane parallel to the upper surface of the semiconductor substrate is defined as an XY plane, and a depth direction of the semiconductor substrate is defined as a Z-axis. The XYZ system forms a right-handed system. In this specification, a case where the semiconductor substrate is viewed in the Z-axis direction is called to as a top view.

In each embodiment, a first conductivity type is exemplified as an N type, and a second conductivity type is exemplified as a P type. However, the first conductivity type may be the P type, and the second conductivity type may be the N type. In this case, the conductivity types of the substrate, layer, region, and the like in each embodiment have opposite polarities.

The doping concentration in the present specification indicates a concentration of impurities changed into donors or acceptors. In the present specification, a concentration difference between the donor and the acceptor may be referred to as a doping concentration. A peak value of the doping concentration distribution in a doping region may be used as a doping concentration in the doping region.

In this specification, layers or regions attached with N or P mean that the majority of carriers are electrons or holes, respectively. "+" and "−" attached to N or P mean a higher doping concentration and a lower doping concentration than layers and regions where it is not attached, respectively.

Figure 1A:
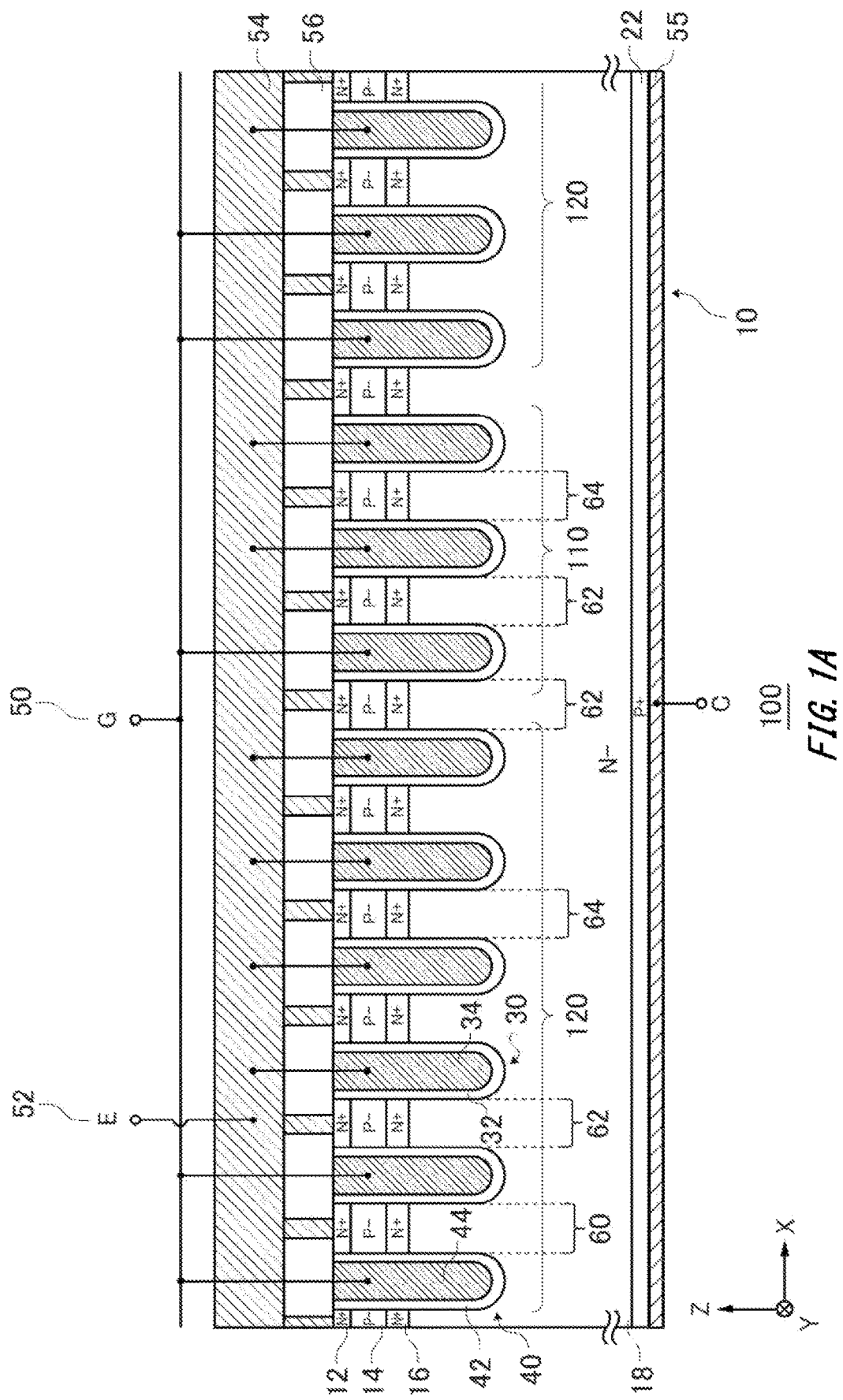
FIG. 1A is an example of a cross-sectional view of a semiconductor device 100 according to an embodiment.

FIG. 1A is an example of a cross-sectional view of a semiconductor device 100 according to an embodiment. The semiconductor device 100 may be an IGBT, or may be a vertical MOSFET. The semiconductor device 100 includes a semiconductor substrate 10. The semiconductor substrate 10 of this example includes a trench group that includes a dummy trench portion 30 and a gate trench portion 40, and a mesa portion that is a dopant diffusion region between the trench groups. The trench group of this example includes a first trench group 110 and a second trench group 120.

The dummy trench portion 30 includes a dummy insulating film 32 and a dummy conductive portion 34. The dummy conductive portion 34 is electrically connected to an emitter electrode 52, and is set to the emitter potential Ve. The emitter potential Ve may be set to the ground potential.

The gate trench portion 40 includes a gate insulating film 42 and a gate conductive portion 44. The gate conductive portion 44 is electrically connected to a gate electrode 50, and set to a gate potential Vg. As an example, the gate potential Vg may be a higher potential than the emitter potential Ve.

The mesa portion of the semiconductor substrate 10 of this example includes a mesa portion 60, a mesa portion 62, and a mesa portion 64. The mesa portion 60 is a region sandwiched between the gate trench portions 40 of the front surface of the semiconductor substrate 10. The mesa portion 62 is a region sandwiched between the gate trench portion 40 and the dummy trench portion 30 of the front surface of the semiconductor substrate 10. The mesa portion 64 is a region sandwiched between the dummy trench portions 30 of the front surface of the semiconductor substrate 10.

The mesa portion 60, the mesa portion 62, or the mesa portion 64 of the semiconductor substrate 10 includes an emitter region 12 of the first conductivity type, a base region 14 of the second conductivity type, a drift region 18 of the first conductivity type provided below the base region 14, and a collector region 22 of the second conductivity type, from the upper surface side. If the semiconductor device 100 is not an IGBT but a vertical MOSFET, the semiconductor substrate 10 does not include a collector region 22.

Figure 1B:
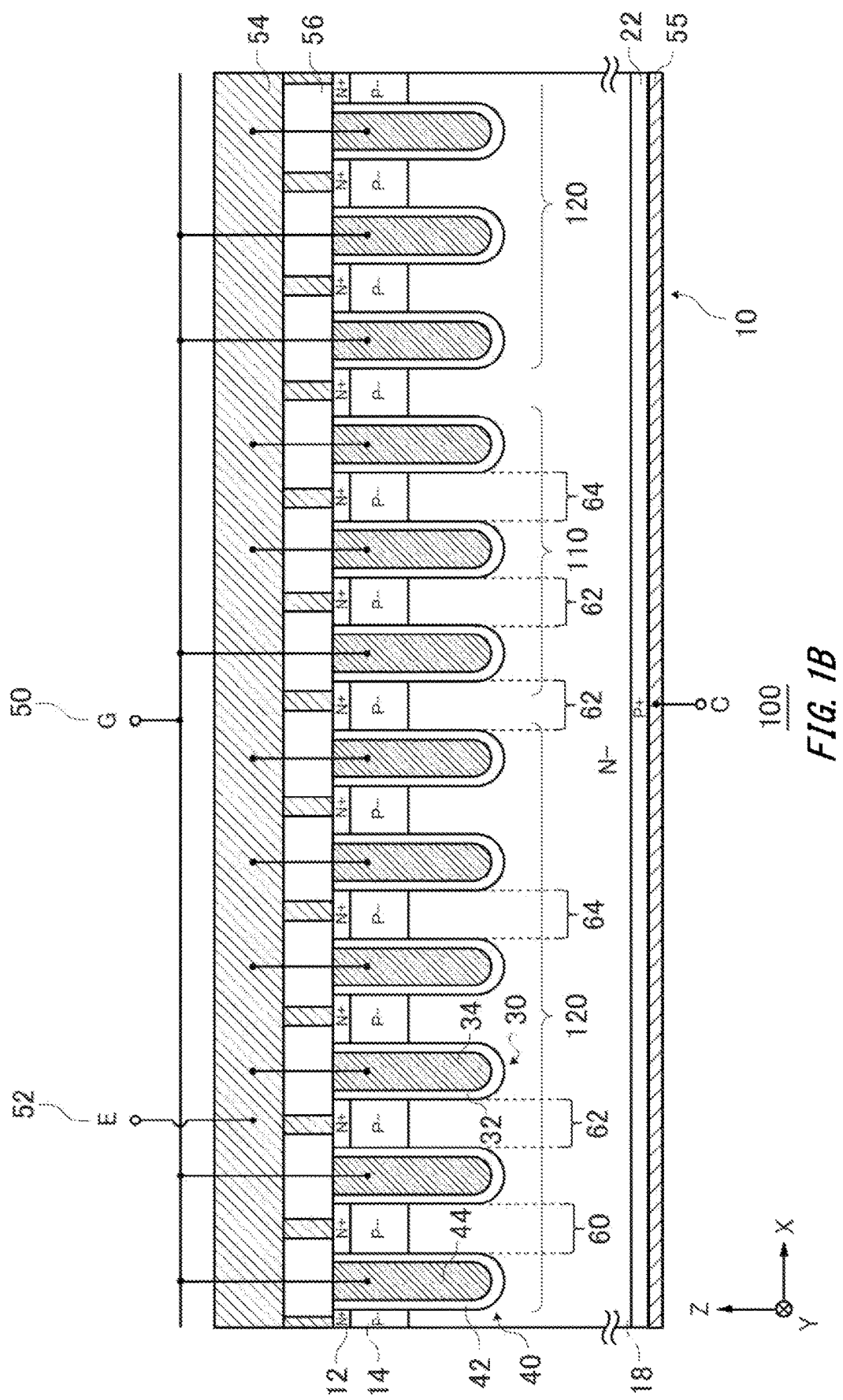
FIG. 1B is another example of the cross-sectional view of the semiconductor device 100 according to the embodiment.

The mesa portion 60, the mesa portion 62, or the mesa portion 64 of this example includes an accumulation region 16 of the first conductivity type provided between the base region 14 and a drift region 18. By providing the accumulation region 16, the IE effect (Injection Enhancement effect) of the carrier to the base region 14 can be improved. However, the accumulation region 16 may be omitted as illustrated in another example of a cross-sectional view of the semiconductor device 100 according to the embodiment of FIG. 1B.

The emitter region 12 is a region of the first conductivity type which is provided on the front surface side of the semiconductor substrate 10. As an example, the emitter region 12 has the polarity of the N+ type.

The base region 14 is a region of the second conductivity type which is provided in contact on the lower side of the emitter region 12. As an example, the base region 14 has the polarity of the P− type. The base region 14 may be exposed to the front surface of the semiconductor substrate 10. When the gate conductive portion 44 is set to the gate potential Vg, electrons are drawn to the gate trench portion 40 side in the base region 14. An N-type channel is formed in a region of the base region 14 that is in contact with the gate trench portion 40, and is driven as a transistor.

In the upper surface of the emitter region 12, a conductor 54 is arranged, and is connected to the emitter electrode 52. In the upper surface of the gate conductive portion 44, an interlayer dielectric film 56 is arranged. The interlayer dielectric film 56 insulates the conductor 54 and the gate conductive portion 44.

In the lower surface of the semiconductor substrate 10, a conductor 55 is provided, and may be connected to an external electrode. If the semiconductor device 100 is an IGBT, the conductor 55 may be provided in the lower surface of the collector region 22, and be connected to the collector electrode.

The first trench group 110 includes one gate trench portion 40, and a plurality of dummy trench portions 30 which are continuously adjacent. The first trench group 110 may be a 1G2E trench group which includes one gate trench portion 40 and two dummy trench portions 30 adjacent to each other and provided adjacent to the one gate trench portion 40. In the first trench group 110, in order to apply the gate potential Vg to the gate conductive portion 44, the electrostatic capacitance Cies between the mesa portion 62, which is sandwiched between the dummy trench portion 30 and the gate trench portion 40, and the gate conductive portion 44 is charged. The entire electrostatic capacitance Cies proportional to the surface area of the gate trench portion 40 is charged, and the electrostatic capacitance Cies to be charged is large.

The second trench group 120 includes two gate trench portions 40 adjacent to each other, and the plurality of dummy trench portions 30. In the second trench group 120, two gate trench portions 40 and the plurality of dummy trench portions 30 are adjacent. The second trench group 120 may include three or more dummy trench portions 30 which are continuously adjacent to each other.

In particular, the second trench group 120 may include four dummy trench portions 30, which are continuously adjacent to each other, provided to be adjacent to two gate trench portions 40 adjacent to each other. If the number of the plurality of dummy trench portions 30 in the second trench group 120 is four, it is called a 2G4E trench group. If the first trench group 110 is a 1G2E trench group, and the second trench group 120 is a 2G4E trench group, the characteristics such as a breakdown voltage of each region are kept equal.

The region including the second trench group 120 of the semiconductor substrate 10 includes the mesa portion 60 between the gate trench portions 40 which as adjacent to each other. The gate potential Vg is applied to both the gate conductive portions 44 of the trench portion adjacent to the mesa portion 60. Therefore, a potential difference between the gate conductive portion 44 and the mesa portion 60 is easily created. That is, in the second trench group 120, the electrostatic capacitance Cies between the gate conductive portion 44 and the emitter region 12 at the time of turning ON becomes smaller than the first trench group 110.

The semiconductor device 100 includes the plurality of first trench groups 110 and the plurality of second trench groups 120. By adjusting the ratio between the number of the plurality of first trench groups 110 and the number of the plurality of second trench groups, the electrostatic capacitance Cies is adjusted, an inclination dV/dt of the potential V, which changes at the time of switching of the semiconductor device 100, with respect to time t can be adjusted.

The characteristics such as the breakdown voltage and the switching characteristic of the semiconductor device 100 depend on a ratio between the numbers of dummy trench portions 30 and gate trench portions 40. If the first trench group 110 is a 1G2E trench group, the second trench group 120 is formed as a 2G4E trench group, so that the inclination dV/dt of the potential V with respect to time t can be adjusted while maintaining the overall performance of the semiconductor device 100.

The plurality of first trench groups 110 and the plurality of second trench groups 120 are provided at a preset ratio. As an example, the ratio between the number of the plurality of first trench groups 110 and the number of the plurality of second trench groups 120 may be 1:1. When the ratio between the number of the plurality of first trench groups 110 and the number of the plurality of second trench groups 120 is 1:1, dV/dt can be reduced over the entire voltage region during switching of the semiconductor device 100. However, the ratio between the number of the plurality of first trench groups 110 and the number of the plurality of second trench groups 120 is not limited to 1:1, and may be 1:3 to 3:1.

In this example, the plurality of first trench groups 110 and the plurality of second trench groups 120 are alternately arranged. That is, the semiconductor device 100 includes a structure in which the first trench group 110 and the second trench group 120 are adjacent to each other. However, the first trench group 110 and the second trench group 120 only need to be arranged to meet a preset arrangement ratio, and are not limited to being alternately arranged.

Figure 1C:
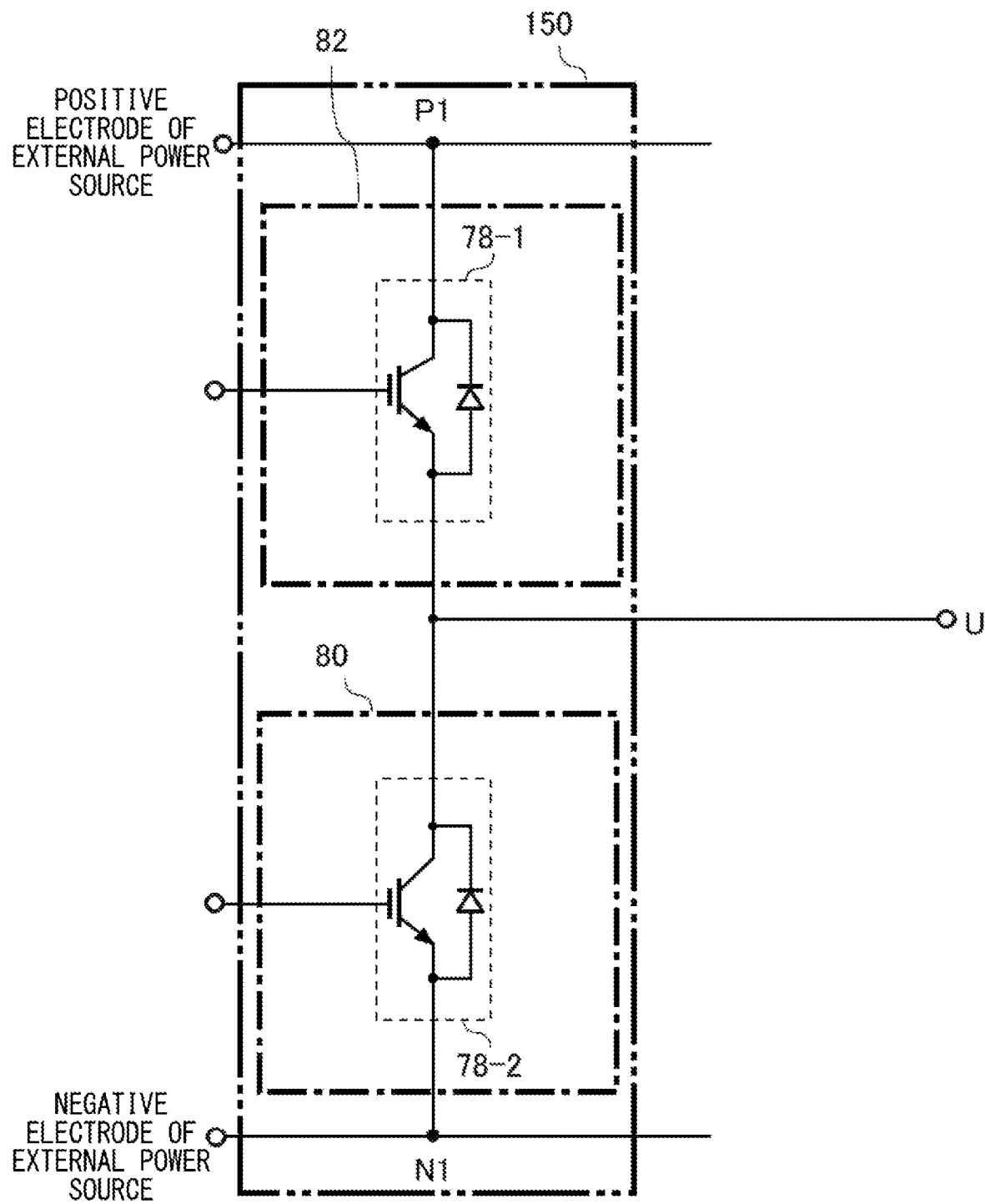
FIG. 1C is an example of a circuit diagram of a semiconductor assembly 150.

FIG. 1C is an example of a circuit diagram of a semiconductor assembly 150. By connecting three semiconductor assemblies 150 in parallel, a three-phase AC inverter circuit having three-phase drive currents of U, V, and W phases, which is a part of the in-vehicle unit for driving the vehicle motor, can be configured.

The case of the U phase will be described. In the semiconductor assembly 150, two semiconductors chips 78 are connected in series. The semiconductor device 100 may configure a circuit element including the semiconductor chip 78.

Among the semiconductor chips in the semiconductor assembly 150, a semiconductor chip 78-2 may configure a lower arm portion 80. On the other hand, among the semiconductor chips in the semiconductor assembly 150, a semiconductor chip 78-1 may configure an upper arm portion 82. Further, a set of the lower arm portion 80 and the upper arm portion 82 included in the semiconductor assembly 150 may configure a leg.

In the lower arm portion 80, the emitter electrode of the semiconductor chip 78-2 may be electrically connected to an input terminal N1, and the collector electrode of the semiconductor chip 78-2 may be electrically connected to an output terminal U, respectively. In the upper arm portion 82, the emitter electrode of the semiconductor chip 78-1 may be electrically connected to the output terminal U, and the collector electrode of the semiconductor chip 78-1 may be electrically connected to an input terminal P1, respectively. The lower arm portion 80 and the upper arm portion 82 are alternately switched by a signal input to a control electrode pad of the semiconductor chip 78.

The input terminal P1 may be connected to the positive electrode of an external power source. The input terminal N1 may be connected to the negative electrode of the external power source. The output terminals U, V, and W may be connected to a load, respectively.

In a semiconductor module, the semiconductor chip 78 may be an RC-IGBT semiconductor chip. In the RC-IGBT semiconductor chip, an IGBT and a freewheel diode (FWD) are integrally formed. In the RC-IGBT semiconductor chip, the IGBT and the FWD may be connected in reverse parallel. Each semiconductor chip 78 may include a combination of a transistor portion such as MOSFET or IGBT and a diode portion. The semiconductor device 100 may be the semiconductor chip 78.

The relationship between the semiconductor chips 78-1 and 78-2 is called a relationship in which the chips are arranged in the facing arms. When the transistor portion arranged in the semiconductor chip 78-2 is turned on, a reverse recovery current flows to the diode portion of the semiconductor chip 78-1 arranged in the facing arm.

When the temporal change in the reverse recovery current is large, the absolute value of radiation noises generated in the diode portion of the semiconductor chip 78-1 becomes large. In this case, a larger surge current flows in the current flowing through the transistor portion arranged in the semiconductor chip 78-2. For example, in an IGBT module having a high breakdown voltage of 1200 V, a large radiation noise is generated at the time of reverse recovery due to the switching operation at a high frequency of 30 to 40 MHz.

Therefore, the smaller the temporal change dV/dt in the voltage when the transistor portion in the semiconductor assembly 150 is turned on, the lower the radiation noise, and the circuit protection and circuit reliability can be improved. In the semiconductor device 100, both the first trench group 110 and the second trench group 120, which are provided at a preset ratio in the front surface of the semiconductor substrate 10, are used, so that dV/dt can be reduced in a wide range from a low voltage side to a high voltage side during the switching operation.

Figure 1D:
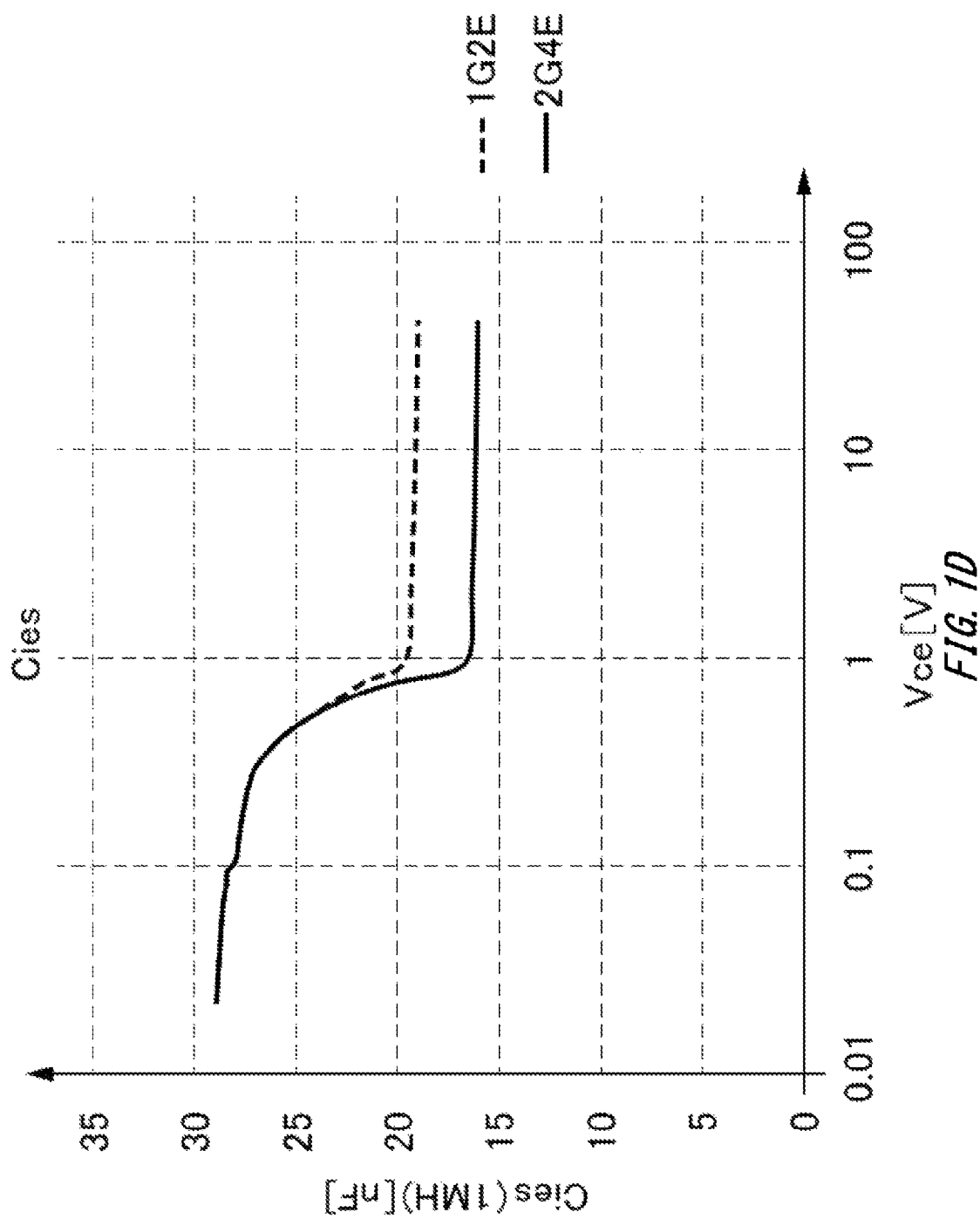
FIG. 1D is a diagram in which the electrostatic capacitances Cies of a first trench group 110 and a second trench group 120 are compared.

FIG. 1D is a comparative diagram in which the electrostatic capacitances Cies of the first trench group 110 and the second trench group 120 are compared. The first trench group 110 has a larger electrostatic capacitance Cies than the second trench group 120.

At the time of turning on the semiconductor device 100, the electrostatic capacitance Cies becomes a reference for drive speed of the semiconductor device 100 on the lower voltage side. During the switching operation of the semiconductor device 100, the capacitance of the electrostatic capacitance Cies becomes small at the time of a high voltage side immediately before the gate-emitter voltage stabilizes. In other words, in a region on a high voltage side, the influence of the number of dummy trench portions 30, which are continuously provided with the adjacent gate trench portion 40, becomes large. Since the number of dummy trench portions 30 continuously provided also has a large influence on the performance of the semiconductor device 100, the number of dummy trench portions 30 continuously provided may be determined based on a desired performance for the semiconductor device 100.

Figure 2A:
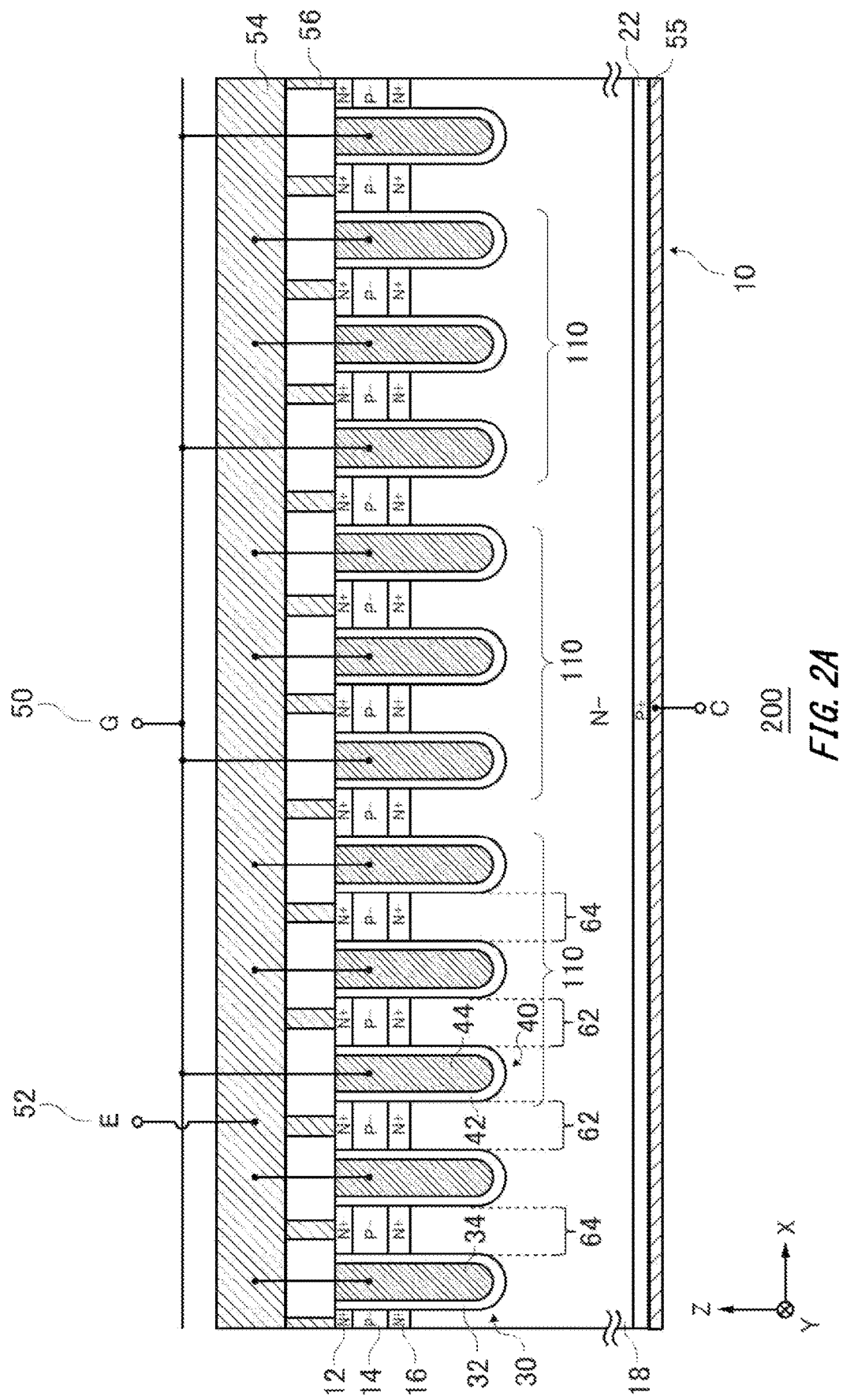
FIG. 2A is a cross-sectional view of a semiconductor device 200 according to a first comparative example.

FIG. 2A is an example of a cross-sectional view of the semiconductor device 200 according to a first comparative example. The semiconductor device 200 includes the first trench group 110, and does not include the second trench group 120.

In the semiconductor device 200, the first trench group 110 is provided repeatedly. In the repeated configuration of the first trench group 110, the trench portions on both sides adjacent to one gate trench portion 40 become the dummy trench portion 30. That is, the facing area between the gate trench portion 40 and the dummy trench portion 30 is large.

Since the facing area of the gate trench portion 40 and the dummy trench portion 30 is large, the electrostatic capacitance Cies for driving the switching device increases. Therefore, at the time of turning-ON, dV/dt becomes small on a low voltage side when driving the first trench group 110.

Figure 2B:
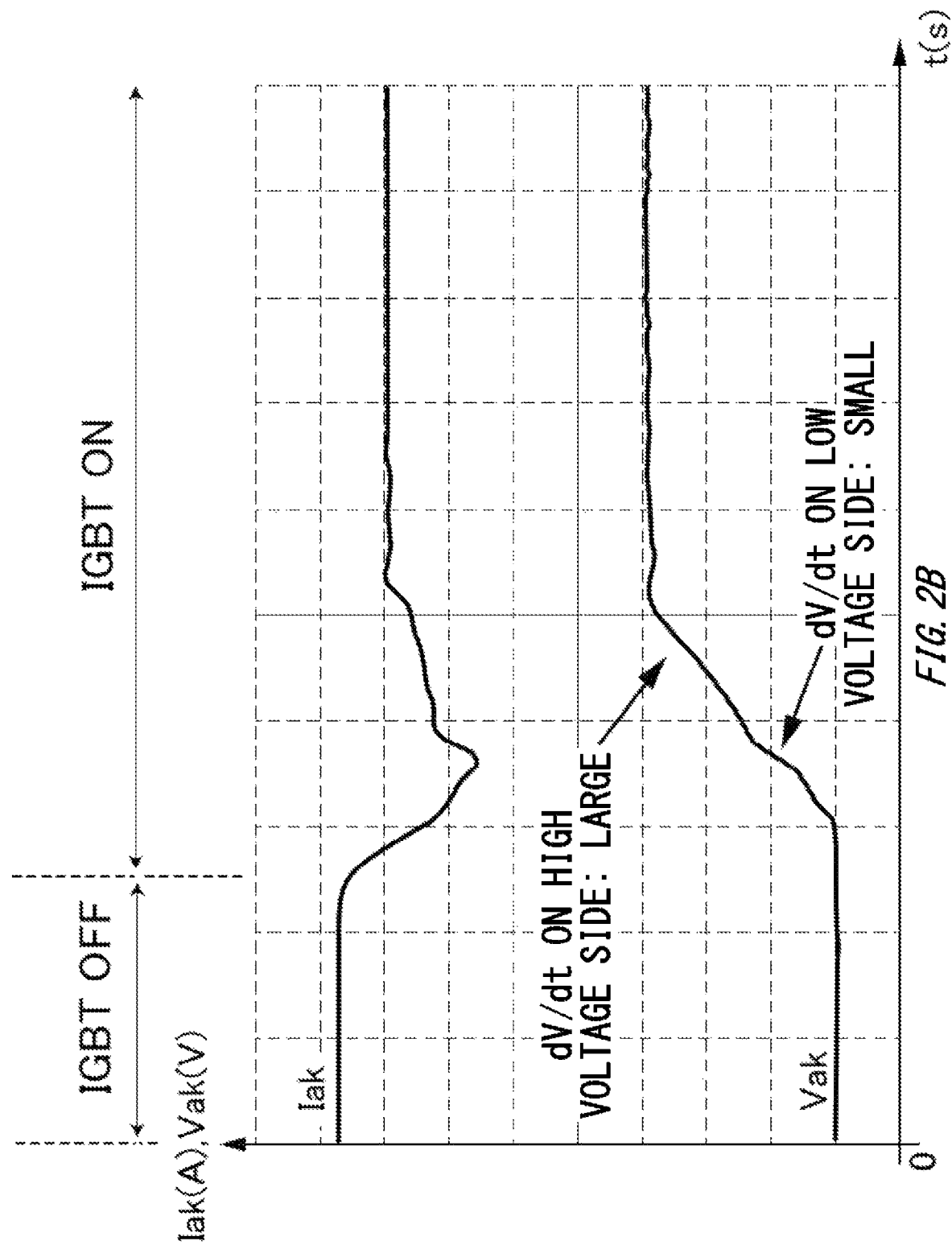
FIG. 2B is a diagram illustrating a change in a current Iak and a voltage Vak of the semiconductor device 200 with respect to time t.

FIG. 2B is a diagram illustrating a change in a current Iak and a voltage Vak of the semiconductor device 200 with respect to time t. The temporal change in the current Iak flowing between the anode (a) and the cathode (k) of the diode portion of the semiconductor device 200 of the chip provided in the arm facing the chip including the semiconductor device 200 and in the voltage Vak between the anode and the cathode at the time of switching of the semiconductor device 200 is illustrated.

When the voltage is gradually applied to the gate conductive portion 44, the voltage Vak flowing between the facing arms of the IGBT increases, and the current Iak is reduced, and then stabilizes to have a constant value. The inclination dV/dt of the voltage Vak changes over time.

In the first trench group 110, the change dV/dt in the voltage Vak over time t at the start of switching is small. On the other hand, the change dV/dt of the voltage Vak over time t immediately before the voltage Vak becomes a high voltage and stabilizes is large.

When dV/dt has a large value, the absolute value of nose in voltage change also becomes large. The semiconductor device 200 having the first trench group 110 takes a larger dV/dt value than the semiconductor device 100 at a high voltage and before the voltage stabilizes.

Figure 3A:
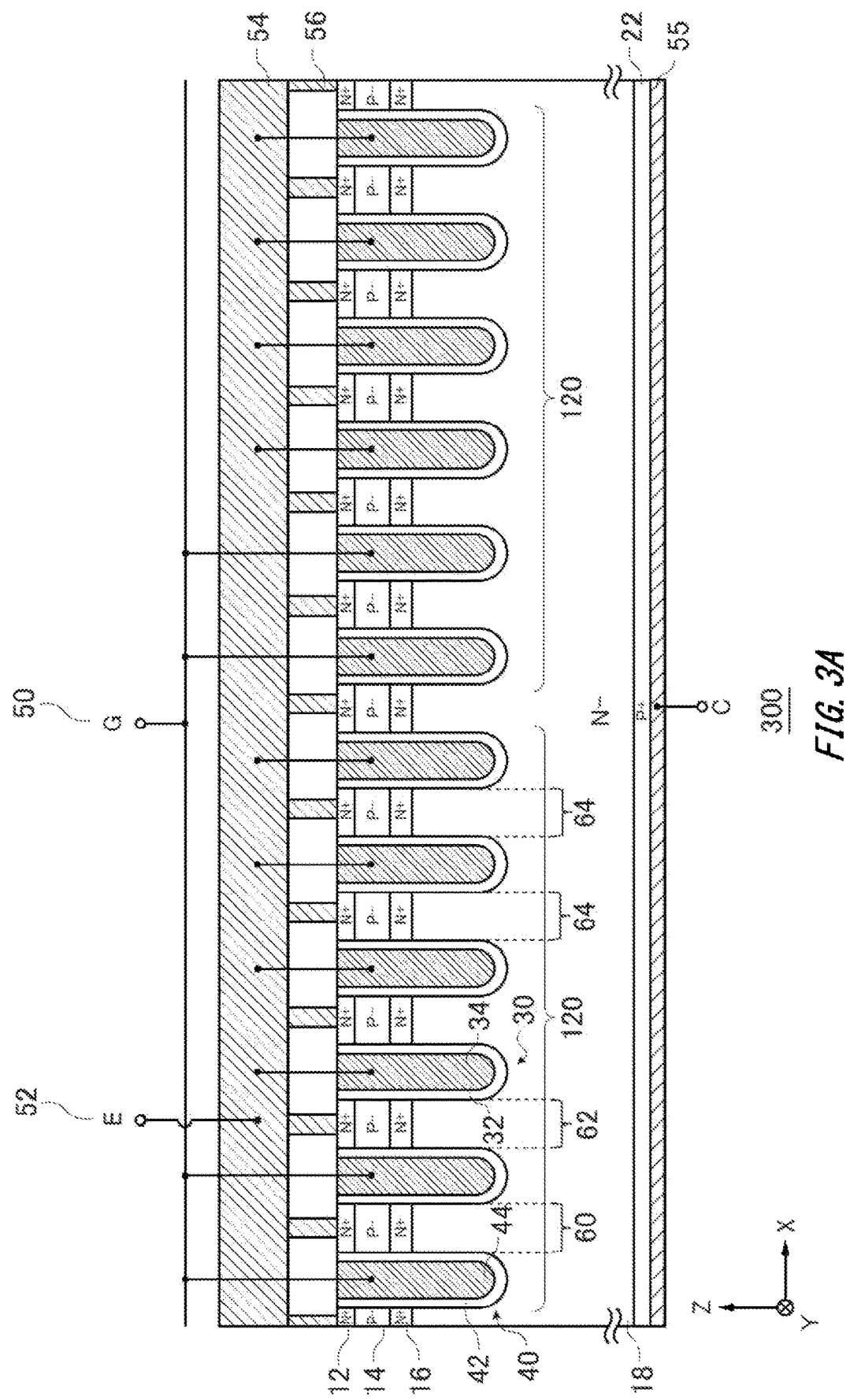
FIG. 3A is a cross-sectional view of a semiconductor device 300 according to a second comparative example.

FIG. 3A is a cross-sectional view of a semiconductor device 300 according to a second comparative example. The semiconductor substrate 10 according to the semiconductor device 300 includes the second trench group 120, and does not include the first trench group 110.

In the semiconductor device 300, the second trench group 120 is repeatedly provided. In particular, a 2G4E trench group is repeatedly provided in the semiconductor device 300. In the second trench group 120, both the trench portions adjacent to the mesa portion 60 are set to the gate potential Vg in the mesa portion 60 to which the gate trench portions 40 are adjacent. That is, the potential difference between the gate conductive portion 44 and the mesa portion 60 becomes large, and an N-type channel is easily formed in the base region 14. This corresponds to a small electrostatic capacitance Cies between the gate conductive portion 44 and the emitter region 12 at the time of driving the semiconductor device 300.

Figure 3B:
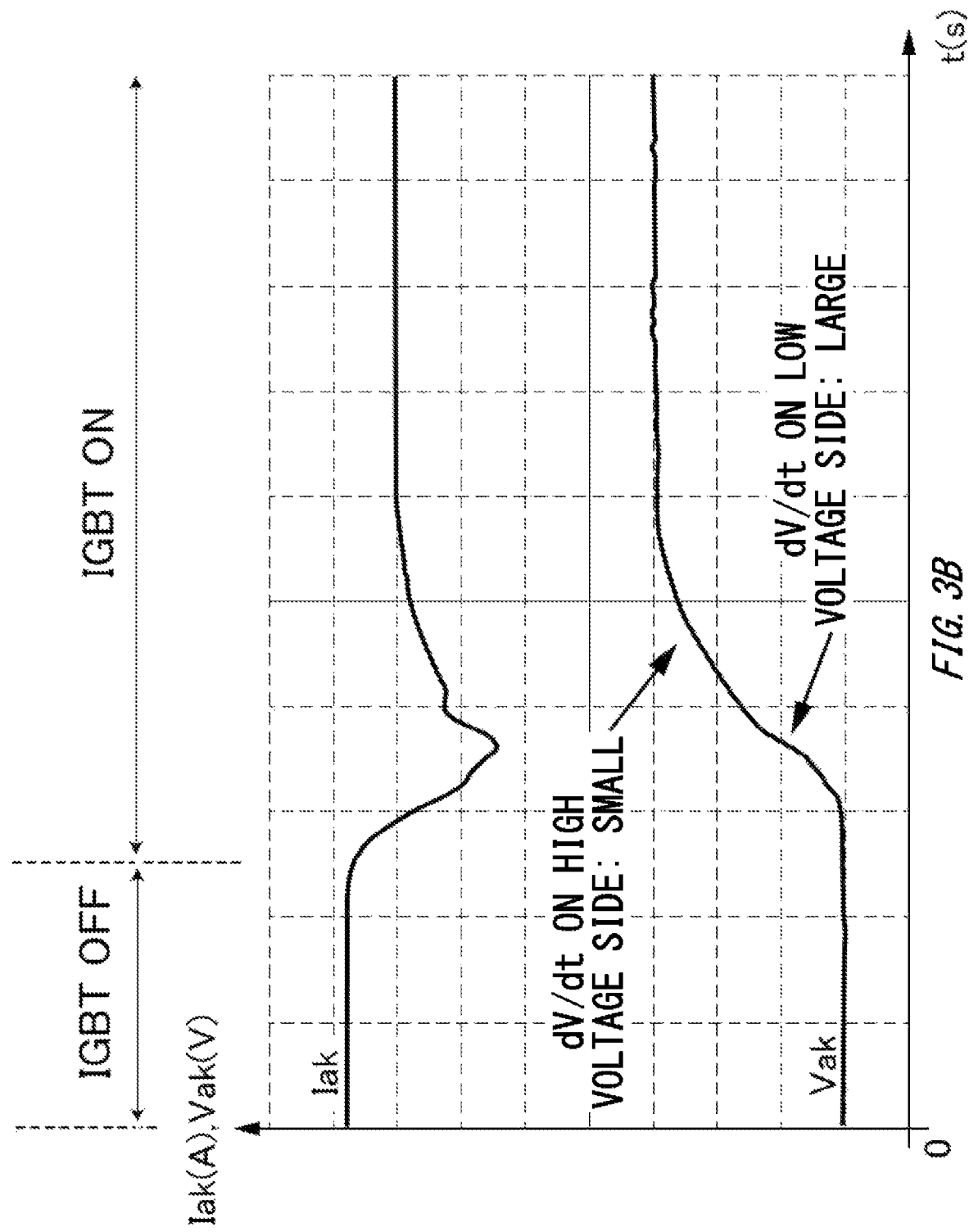
FIG. 3B is a diagram illustrating a change in a current Iak and a voltage Vak of the semiconductor device 300 with respect to time t.

FIG. 3B is a diagram illustrating a change in the current Iak and the voltage Vak of the semiconductor device 300 with respect to time t. The temporal change in the current Iak and in the voltage Vak flowing in the diode portion of the semiconductor device 300 of the chip provided in the arm facing the chip including the semiconductor device 300 at the time of switching of the semiconductor device 300 is illustrated.

Similarly to the semiconductor device 200, when the voltage is gradually applied to the gate conductive portion 44, the voltage Vak flowing between the facing arms of the IGBT increases, and the current Iak is reduced, and then stabilizes to have a constant value. The semiconductor device 300 having the second trench group 120 has a large dV/dt on a low voltage side, and a small dV/dt on a high voltage side with respect to the semiconductor device 200 which has only the first trench group 110.

Since the electrostatic capacitance Cies of the semiconductor device 300 is small, dV/dt at the time of a low voltage when turning on becomes large. On the other hand, when stabilizing to a high voltage after driving, the mesa portion 62 between the dummy trench portion 30 and the gate trench portion 40 and the mesa portion 60 between the gate trench portions 40 are provided, so that the value dV/dt is reduced by the difference in electrostatic capacitance Cies.

Figure 4:
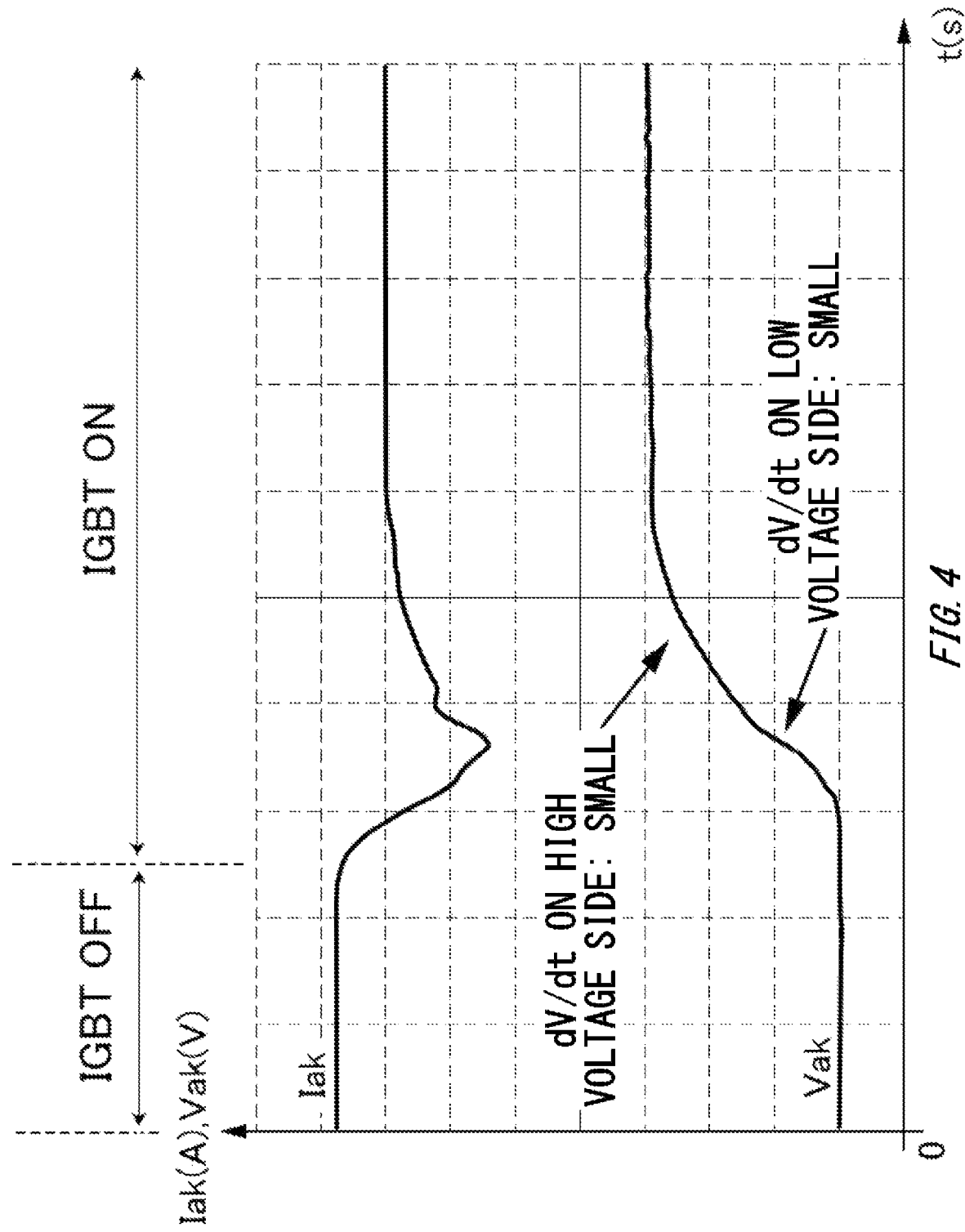
FIG. 4 is a diagram illustrating a change in a current Iak and a voltage Vak of the semiconductor device 100 with respect to time t.

FIG. 4 is a diagram illustrating a change in the current Iak and the voltage Vak of the semiconductor device 100 with respect to time t. The temporal change in the voltage Vak at the time of turning on the semiconductor device 100 is illustrated.

The semiconductor device 100 has characteristics that combine the characteristic of the semiconductor device 200 on a low voltage side and the characteristic of the semiconductor device 300 on a high voltage side. That is, a small value dV/dt is provided either on a low voltage side or on a high voltage side.

Since dV/dt of the semiconductor device 100 is small, the absolute value of nose generated in the voltage Vak and the current Iak becomes small in the semiconductor device 100. Therefore, in the semiconductor device 100, it is possible to sufficiently protect the elements, and configure a highly reliable circuit.

Figure 5:
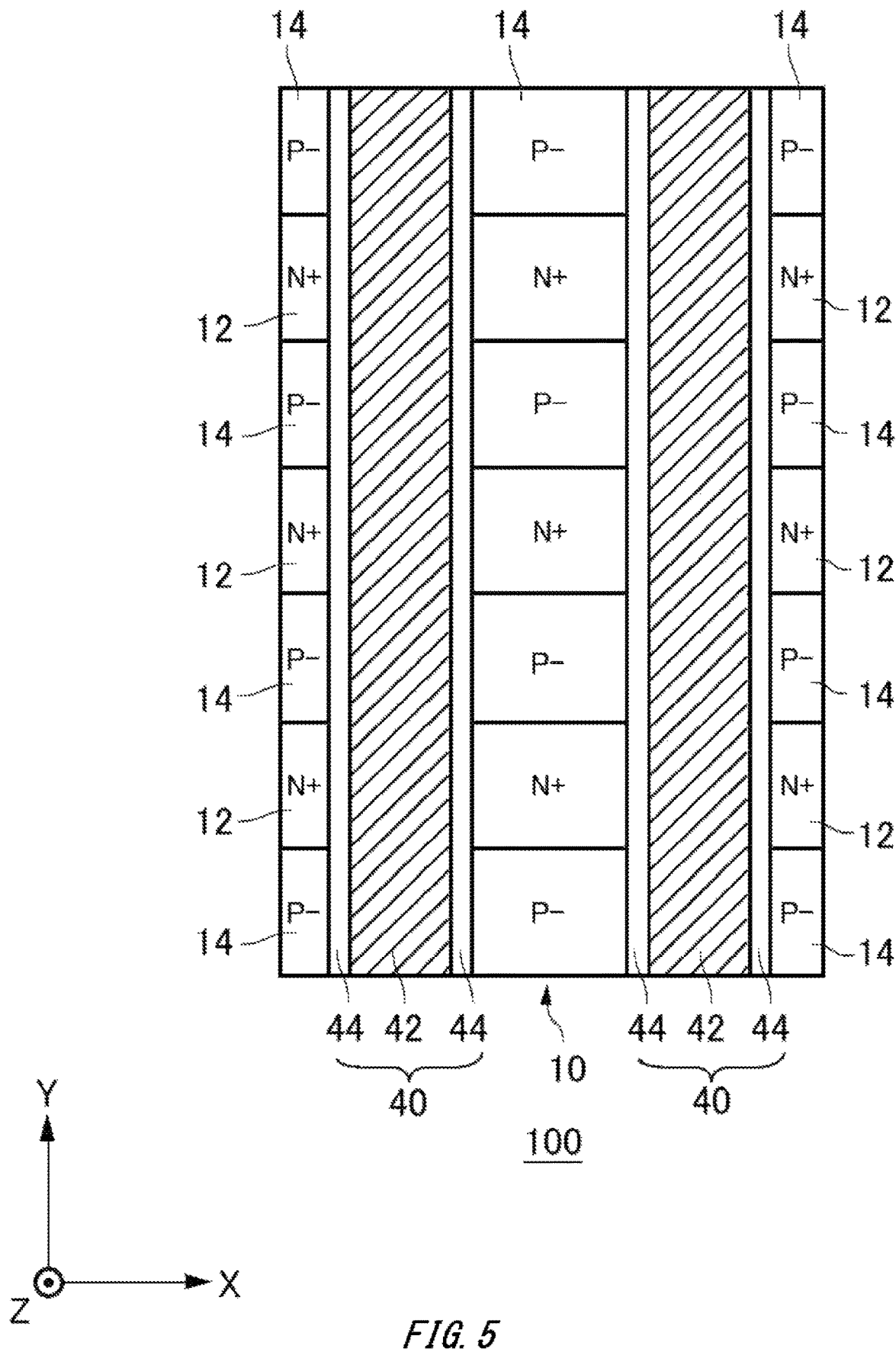
FIG. 5 is an example of the upper view of a mesa portion 60 of the semiconductor device 100.

FIG. 5 is an example of the upper view of the mesa portion 60 of the semiconductor device 100. In this example, the configuration of the mesa portion 60 sandwiched by the gate trench portions 40 is illustrated. However, the mesa portion 62 or the mesa portion 64 may have the same configuration. That is, the mesa portion sandwiched by at least two of the plurality of gate trench portions 40 and the plurality of dummy trench portions 30 may have the same configuration.

The base region 14 and the emitter region 12 of this example are alternately arranged in a stretching direction of two gate trench portions 40 in contact with the mesa portion 60. If the semiconductor device 100 is an IGBT, the latch-up of the IGBT is suppressed by the configuration of the mesa portion 60 in the upper surface of the semiconductor substrate 10.

Figure 6:
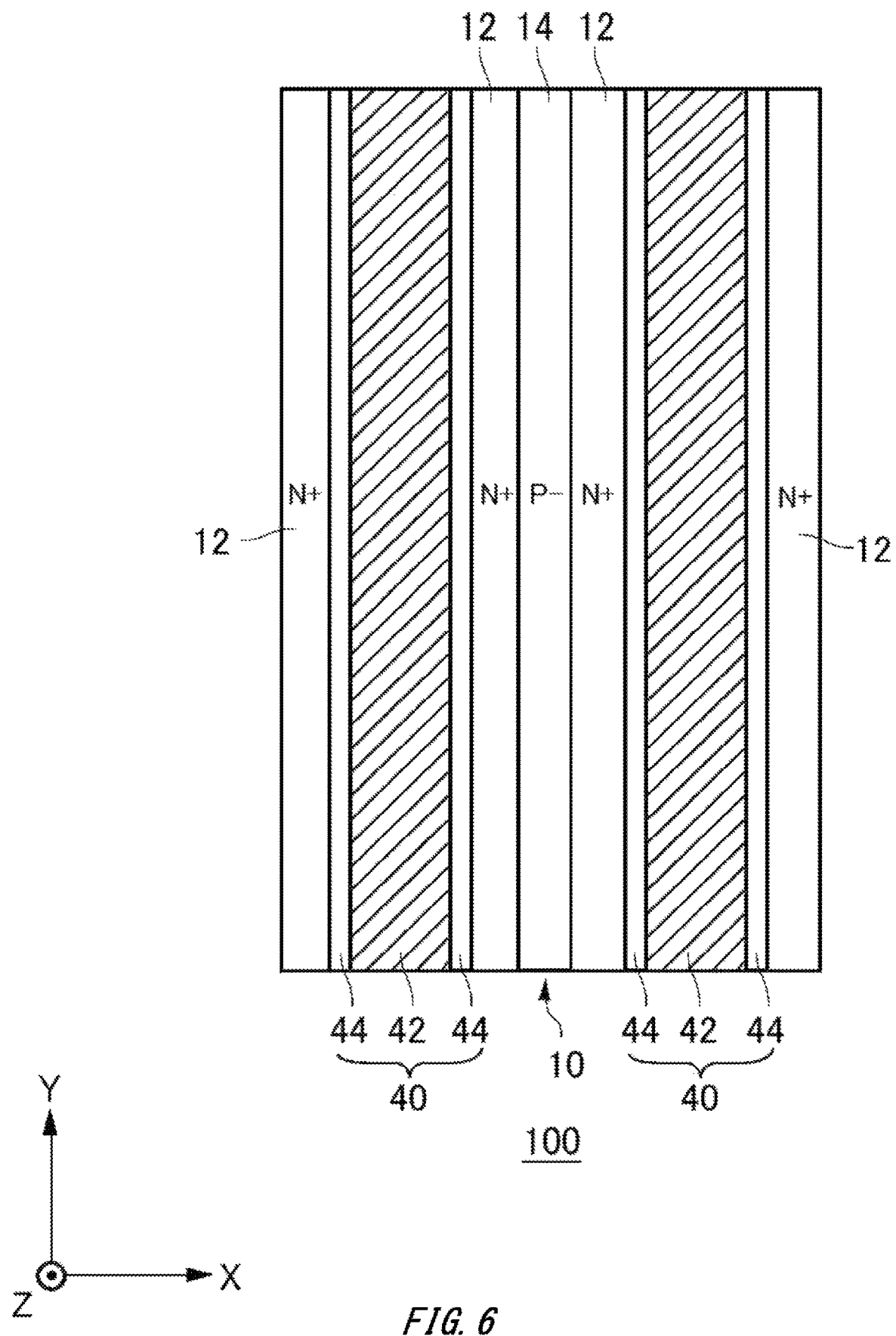
FIG. 6 is another example of the upper view of the mesa portion 60 of the semiconductor device 100.

FIG. 6 is another example of the upper view of the mesa portion 60 of the semiconductor device 100. In this example, the configuration of the mesa portion 60 sandwiched by the gate trench portions 40 is illustrated. However, the mesa portion 62 or the mesa portion 64 may have the same configuration. That is, the mesa portion sandwiched by at least two of the plurality of gate trench portions 40 and the plurality of dummy trench portions 30 may have the same configuration.

The emitter region 12 of this example stretches in contact with two gate trench portions 40 that are in contact with the mesa portion 60. The emitter region 12 is arranged to sandwich the base region 14. The configuration of the mesa portion 60 of this example is called as a basic structure.

While the embodiments of the present invention have been described, the technical scope of the invention is not limited to the above described embodiments. It is apparent to persons skilled in the art that various alterations or improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

| EXPLANATION OF REFERENCES | |
|---|---|
| 10: | semiconductor substrate |
| 12: | emitter region |
| 14: | base region |
| 16: | accumulation region |
| 18: | drift region |
| 22: | collector region |
| 30: | dummy trench portion |
| 32: | dummy insulating film |
| 34: | dummy conductive portion |
| 40: | gate trench portion |
| 42: | gate insulating film |
| 44: | gate conductive portion |
| 50: | gate electrode |
| 52: | emitter electrode |
| 54: | conductor |
| 55: | conductor |
| 56: | interlayer insulating film |
| 60: | mesa portion |
| 62: | mesa portion |
| 64: | mesa portion |
| 78: | semiconductor chip |
| 80: | lower arm portion |
| 82: | upper arm portion |
| 100: | semiconductor device |
| 110: | first trench group |
| 120: | second trench group |
| 150: | semiconductor assembly |
| 200: | semiconductor device |
| 300: | semiconductor device |

What is claimed is:

1. A semiconductor device that has a plurality of gate trench portions electrically connected to a gate electrode, and a plurality of dummy trench portions electrically connected to an emitter electrode, the plurality of gate trench portions comprising:
   a first trench group that includes only one gate trench portion not adjacent any other gate trench portion, and two dummy trench portions which are provided adjacent to the only one gate trench portion and adjacent to each other; and
   a second trench group that includes two gate trench portions adjacent to each other among the plurality of gate trench portions, wherein
   the first trench group and the second trench group repeat in the semiconductor device according to a preset ratio.

2. The semiconductor device according to claim 1, wherein the second trench group further includes
   three or more dummy trench portions which are continuously adjacent among the plurality of dummy trench portions.

3. The semiconductor device according to claim 2, wherein the second trench group further includes
   four dummy trench portions which are continuously adjacent among the plurality of dummy trench portions, and
   wherein the two gate trench portions and the four dummy trench portions are adjacent.

4. The semiconductor device according to claim 3, wherein the preset ratio between the number of the plurality of first trench groups and the number of the plurality of second trench groups is 1:1.

5. The semiconductor device according to claim 2, wherein the first trench group and the second trench group are adjacent to each other.

6. The semiconductor device according to claim 2, wherein the preset ratio between the number of the plurality of first trench groups and the number of the plurality of second trench groups is 1:1.

7. The semiconductor device according to claim 2, comprising:
   an emitter region of a first conductivity type;
   a base region of a second conductivity type which has a polarity different from the first conductivity type;
   a drift region of the first conductivity type which is provided below the base region and has a doping concentration lower than the emitter region; and
   an accumulation region of the first conductivity type which is provided between the base region and the drift region, and has a doping concentration higher than the drift region.

8. The semiconductor device according to claim 2, comprising:
   a mesa portion that is sandwiched by at least two of the plurality of gate trench portions and the plurality of dummy trench portions, the mesa portion including
   an emitter region of a first conductivity type, and
   a base region of a second conductivity type which has a polarity different from the first conductivity type,
   wherein the base region and the emitter region are alternately arranged in a stretching direction of a gate trench portion of a dummy trench portion in contact with the mesa portion.

9. The semiconductor device according to claim 2, comprising:
   a mesa portion that is sandwiched by at least two of the plurality of gate trench portions and the plurality of dummy trench portions, the mesa portion including
   an emitter region of a first conductivity type, and
   a base region of a second conductivity type which has a polarity different from the first conductivity type,
   wherein the emitter region includes two emitter regions, and the two emitter regions stretch in contact with a gate trench portion or a dummy trench portion which is in contact with the mesa portion, and sandwich the base region.

10. The semiconductor device according to claim 1, wherein the second trench group further includes
    four dummy trench portions which are continuously adjacent among the plurality of dummy trench portions, and
    wherein the two gate trench portions and the four dummy trench portions are adjacent.

11. The semiconductor device according to claim 10, wherein the first trench group and the second group trench group are adjacent to each other.

12. The semiconductor device according to claim 10, wherein the preset ratio between the number of the plurality of first trench groups and the number of the plurality of second trench groups is 1:1.

13. The semiconductor device according to claim 10, comprising:
    an emitter region of a first conductivity type;
    a base region of a second conductivity type which has a polarity different from the first conductivity type;
    a drift region of the first conductivity type which is provided below the base region, and has a doping concentration lower than the emitter region; and
    an accumulation region of the first conductivity type which is provided between the base region and the drift region, and has a doping concentration higher than the drift region.

14. The semiconductor device according to claim 10, comprising:
    a mesa portion that is sandwiched by at least two of the plurality of gate trench portions and the plurality of dummy trench portions, the mesa portion including
    an emitter region of a first conductivity type, and
    a base region of a second conductivity type which has a polarity different from the first conductivity type,
    wherein the base region and the emitter region are alternately arranged in a stretching direction of a gate trench portion or a dummy trench portion in contact with the mesa portion.

15. The semiconductor device according to claim 10, comprising:
    a mesa portion that is sandwiched by at least two of the plurality of gate trench portions and the plurality of dummy trench portions, the mesa portion including
    an emitter region of a first conductivity type, and
    a base region of a second conductivity type which has a polarity different from the first conductivity type,
    wherein the emitter region includes two emitter regions, and the two emitter regions stretch in contact with a gate trench portion or a dummy trench portion which is in contact with the mesa portion, and sandwich the base region.

16. The semiconductor device according to claim 1, wherein the first trench group and the second trench group are adjacent to each other.

17. The semiconductor device according to claim 1, wherein the preset ratio between a number of the plurality of first trench groups and a number of the plurality of second trench groups is 1:1.

18. The semiconductor device according to claim 1, comprising:
- an emitter region of a first conductivity type;
- a base region of a second conductivity type which has a polarity different from the first conductivity type;
- a drift region of the first conductivity type which is provided below the base region, and has a doping concentration lower than the emitter region; and
- an accumulation region of the first conductivity type which is provided between the base region and the drift region, and has a doping concentration higher than the drift region.

19. The semiconductor device according to claim 1, comprising:
- a mesa portion that is sandwiched by at least two of the plurality of gate trench portions and the plurality of dummy trench portions, the mesa portion including
- an emitter region of a first conductivity type, and
- a base region of a second conductivity type which has a polarity different from the first conductivity type,
- wherein the base region and the emitter region are alternately arranged in a stretching direction of a gate trench portion or a dummy trench portion in contact with the mesa portion.

20. The semiconductor device according to claim 1, comprising:
- a mesa portion that is sandwiched by at least two of the plurality of gate trench portions and the plurality of dummy trench portions, the mesa portion including
- an emitter region of a first conductivity type, and
- a base region of a second conductivity type which has a polarity different from the first conductivity type,
- wherein the emitter region includes two emitter regions, and the two emitter regions stretch in contact with a gate trench portion or a dummy trench portion which is in contact with the mesa portion, and sandwich the base region.

* * * * *